(12) United States Patent
Hu

(10) Patent No.: US 9,807,900 B2
(45) Date of Patent: Oct. 31, 2017

(54) HIGH DENSITY STORAGE ASSEMBLY

(71) Applicant: CHENBRO MICOM CO., LTD., New Taipei (TW)

(72) Inventor: Tseng-Hsun Hu, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 15/007,476

(22) Filed: Jan. 27, 2016

(65) Prior Publication Data

US 2017/0011776 A1 Jan. 12, 2017

(30) Foreign Application Priority Data

Jan. 27, 2015 (TW) .............................. 104201282 U

(51) Int. Cl.
  *H05K 7/14* (2006.01)
  *G11B 33/12* (2006.01)
  *G11B 33/04* (2006.01)

(52) U.S. Cl.
  CPC ....... *H05K 7/1487* (2013.01); *G11B 33/0466* (2013.01); *G11B 33/128* (2013.01)

(58) Field of Classification Search
  CPC . H05K 7/1487; G11B 33/128; G11B 33/0466
  USPC ............................... 361/679.31; 312/222–227
  See application file for complete search history.

(56) References Cited

U.S. PATENT DOCUMENTS

| 2015/0070830 | A1* | 3/2015 | Iwasaki | H05K 7/1487 361/679.33 |
| 2015/0342080 | A1* | 11/2015 | Chen | H05K 7/20736 361/679.31 |
| 2015/0355686 | A1* | 12/2015 | Heyd | G06F 1/187 361/679.31 |
| 2016/0135322 | A1* | 5/2016 | Chen | G11B 33/142 361/679.46 |
| 2016/0353598 | A1* | 12/2016 | Chen | H05K 7/1487 |
| 2017/0011776 | A1* | 1/2017 | Hu | H05K 7/1487 |

* cited by examiner

*Primary Examiner* — Anthony Haughton
*Assistant Examiner* — Yahya Ahmad
(74) *Attorney, Agent, or Firm* — Bacon & Thomas, PLLC

(57) ABSTRACT

A high-density storage assembly having a casing, an engaging mechanism, and a recording medium machine; the casing has a receiving space, with a plurality of fixing portions disposed on a substrate at a bottom of the casing, the engaging mechanism has at least two supporting portions arranged in a side by side in a transverse width direction, each having a coupling portion and a supporting plate, with the coupling portions connected to the fixing portions of the substrate of the casing, respectively, and extended upward and obliquely to form the supporting plates. A containing space for movably placing and positioning the recording medium machine is formed between an abutting leaf spring and a limit plate which are disposed on a lower surface of the supporting plate of one of two adjacent said supporting portions and an upper surface of the supporting plate of another said supporting portion, respectively.

16 Claims, 6 Drawing Sheets

HIGH DENSITY STORAGE ASSEMBLY

BACKGROUND OF THE INVENTION

1. Field of the Invention

The present invention relates to high-density storage assembly and, more particularly, to a high-density storage assembly characterized in that engaging mechanisms positioned on a substrate of a casing are arranged in oblique arrays so that more recording medium machines are contained in the casing of limited height and space.

2. Description of the Prior Art

Given today's trend toward network-based cloud technology, computer server technology develops rapidly by leaps and bounds and changes rapidly, aiming at robust compute capability, high speed and compactness. To process voluminous data computation, computer servers require intensively numerous high-density recording medium machines, such as disk drives, hard disk drives, CD-ROM, and CD-RW, for storing data. However, a server case is movably held within a receiving space of every bay in a conventional rack server, and server units are connected to each other to effectuate server multiplexing. Hence, a device servo system in its entirety is regarded as an enormous cabinet, and each server case holds recording medium machines arranged side by side to increase the storage capacity of the rack server.

Depending on height, conventional server cases come in four specifications, namely 1U, 2U, 3U and 4U, wherein U (unit) is defined as a unit height of a cabinet. Basically, a cabinet of 1U is 19 inches wide and 4.445 cm tall, whereas a cabinet of 2U is 19 inches wide and 8.89 cm tall, and thus the width and height of cabinets of 3U, 4U are inferred by analogy. Hence, with all servers being subjected to a specification limit of equal size and space, manufacturers have to study how to place more recording medium machines within limited space and give considerations to difficulties in spatial configuration, means of securing, assembly, disassembly and replacement of the recording medium machines contained in server cases. The manufacturers fully understand that any structure that takes up little space and is easy to maintain and change must be able to get in line with the trend toward the downsizing of computer servers.

Furthermore, since conventional server cases and storage-oriented/telecommunication-oriented cabinets contain plenty of recording medium machines, such as hard disk drives, CD-ROM, and CD-RW, the recording medium machines contained in the cases and cabinets must be changed easily and quickly in order for users to perform maintenance or replacement operations on the recording medium machines. Moreover, considerations must be given to assembly structures and component manufacturing costs in order to meet the need for a large number of recording medium machines and achieve cost-effectiveness thereof. Also, after long use of server cases, considerations must be given to stability and ease of maintenance and replace of the system in its entirety as well as convenience of users' operation to reduce loss arising from shutdowns and incurred labor costs. However, some conventional recording medium machines are fixed in place and arranged side by side inside server cases by screws, and it is time-consuming for the screws to be aimed at and driven into screw holes, thereby lengthening the shutdown-maintenance duration greatly. If there are plenty of components, such as interface cards, recording medium machines and power lines, inside the server cases, it will be inconvenient for a screwdriver to perform a screwing process inside the server cases, not to mention that the screws may get lost during the screwing process. In the event of inappropriate size of the screws and performing the screwing process forcibly, the fixing holes of the recording medium machines will be damaged to the detriment of assembly and disassembly. Conventional assembly/disassembly processes of recording medium machines have a trend toward simple, tool-free and screw-free operation. Some recording medium machines are fixed in place by leaf spring-based engagement; however, the recording medium machines are likely to get disconnected, fall off and thus get damaged when subjected to collisions or vibrations while the server cases are been transported.

Furthermore, servers are often provided in computer facilities of a data center and a telecommunication/storage system and can be equipped with tens of thousands of recording medium machines which can be disassembled quickly to undergo maintenance and replacement, if the recording medium machines take up little space and feature ease of maintenance and replacement. Therefore, the prior art still has room for improvement.

SUMMARY OF THE INVENTION

In view of the aforesaid drawbacks of the prior art, it is an objective of the present invention to provide a high-density storage assembly, comprising a casing, an engaging mechanism, and a recording medium machine, characterized in that: the casing has a receiving space, with a plurality of fixing portions disposed on a substrate at a bottom of the casing, wherein the engaging mechanism comprises at least two supporting portions arranged in a side by side in a transverse width direction, each comprising a coupling portion and a supporting plate, with the coupling portions connected to the fixing portions of the substrate of the casing, respectively, and extended upward and obliquely to form the supporting plates, wherein a containing space for movably placing and positioning the recording medium machine is formed between an abutting leaf spring and a limit plate which are disposed on a lower surface of the supporting plate of one of two adjacent said supporting portions and an upper surface of the supporting plate of another said supporting portion, respectively, wherein the abutting leaf spring and the limit plate abut against the recording medium machine, with the abutting leaf spring being a resilient structure.

It is another objective of the present invention to provide a high-density storage assembly, comprising a casing, an engaging mechanism, and a recording medium machine, characterized in that: the casing has a receiving space, with a fixing portion disposed on a substrate at a bottom of the casing, wherein the engaging mechanism comprises supporting portions arranged in a transverse width direction and each comprising a coupling portion and a supporting plates, with the coupling portions connected to the fixing portion of the substrate of the casing and extended upward and obliquely to form the supporting plates, respectively, wherein an abutting leaf spring and a limit plate are disposed at a bottom and a top of the supporting plates each, wherein a containing space for movably placing and positioning the recording medium machine is formed between the abutting leaf springs and the limit plates, wherein the abutting leaf springs and the limit plates abut against the recording medium machine, with the abutting leaf springs being each a resilient structure.

According to the above objects of the present invention, the lower surface of the supporting plate, which the abutting leaf spring is disposed on, extends in a surface direction to form a baffle, wherein the abutting leaf spring is disposed in a direction in which the baffles face the limit plates, and the limit plates are formed by extending the upper surfaces of the supporting plates in a surface direction, with the abutting leaf springs corresponding in position to the limit plates, respectively.

In an embodiment, a plurality of engaging holes is disposed on each of two sides of the recording medium machine, whereas abutting bumps are disposed at the abutting leaf springs, with limit bumps disposed on the limit plates, wherein the abutting bumps and the limit bumps are engaged with the engaging holes of the recording medium machine, respectively.

In another embodiment, each said baffle horizontally extends to form a bottom plate.

In another embodiment, the supporting plates each extend from surfaces thereof downward and obliquely to form a bent pressing leaf spring.

In another embodiment, the baffles of the engaging mechanism are capable of being separated from, connected to, and positioned at the supporting portions obliquely and from behind, wherein, barring the baffles, the engaging mechanism is made of a rigid material comprising one of zinc-plated steel sheet and hot-dip galvanized steel in coils, wherein the baffles and the abutting leaf springs thereof are made of a resilient material comprising one of plastic, stainless steel, and manganese steel.

In another embodiment, two bent engaging plates are disposed at the fixing portions of the casing, and the coupling portion of the supporting plate of each said supporting portion comprises a positioning portion, with the positioning portions extending outward from bottom ends of the supporting plates for a distance, and positioning holes corresponding in position to the two bent engaging plates are concavely disposed on an outer edge of the positioning portion.

In another embodiment, wherein the fixing portions of the casing comprise two locking holes, wherein two ends of the supporting plates each extend downward to form supporting arms and fixing holes each with a horizontal bottom, with the fixing holes corresponding in position to the two locking holes, respectively, screws pass through the fixing holes to get screwedly fixed to the locking holes, respectively.

Moreover, according to the above objects of the present invention, two bent engaging plates and two locking holes are disposed at the fixing portions of the casing, and the coupling portion of the supporting plate of each said supporting portion comprises a positioning portion, with the positioning portions extending outward from bottom ends of the supporting plates for a distance, wherein positioning holes corresponding in position to the two bent engaging plates are concavely disposed on an outer edge of the positioning portion, and two ends of the supporting plates each extend downward to form supporting arms and fixing holes each with a horizontal bottom, with the fixing holes corresponding in position to the two locking holes, respectively, screws pass through the fixing holes to get screwedly fixed to the locking holes, respectively.

In an embodiment, the support plates and a guiding slope extending horizontally upward are formed by stamping the engaging plates upward from the substrate.

Further, according to the above objects of the present invention, a height by which the coupling portion extends upward and obliquely to form the supporting plates conforms with a height of the receiving space of the casing.

According to the above objects, the present invention comprising a casing, an engaging mechanism, and a recording medium machine, characterized in that: the casing has a receiving space, with a fixing portion disposed on a substrate at a bottom of the casing, wherein the engaging mechanism comprises supporting portions arranged in a transverse width direction and each comprising a coupling portion and a supporting plates, with the coupling portions connected to the fixing portion of the substrate of the casing and extended upward and obliquely to form the supporting plates, respectively, wherein an abutting leaf spring and a limit plate are disposed at a bottom and a top of the supporting plates each, wherein a containing space for movably placing and positioning the recording medium machine is formed between the abutting leaf springs and the limit plates, wherein the abutting leaf springs and the limit plates abut against the recording medium machine, with the abutting leaf springs being each a resilient structure.

In an embodiment, bottoms of upper surfaces of the supporting plates extend in a surface direction to form the abutting leaf springs, wherein the abutting leaf springs correspond in position to the limit plates, respectively, wherein tops of upper surfaces of the supporting plates extend in a surface direction to form the limit plates, with the abutting leaf springs corresponding in position to the limit plates, respectively.

In another embodiment, a plurality of leaf springs is disposed on each of two sides of the recording medium machine, wherein abutting bumps are disposed at the abutting leaf springs, with limit bumps disposed on the limit plates, wherein the abutting bumps and the limit bumps are engaged with the leaf springs of the recording medium machine, respectively.

In another embodiment, limit bumps of limit plates are disposed on one of engaging holes of the recording medium machine and correspond in position to the supporting portion, whereas the abutting leaf spring with a baffle capable of resilient deformation and restoration is disposed on another engaging hole of the recording medium machine and corresponds in position to the supporting portion, with the engaging holes fitting around the abutting bumps, respectively.

In another embodiment, the engaging mechanism is made of a rigid material, such as zinc-plated steel sheet or hot-dip galvanized steel in coils, whereas the abutting leaf springs are made of a resilient material comprising one of plastic, stainless steel and manganese steel.

DETAILED DESCRIPTION OF THE EMBODIMENT OF THE INVENTION

Figure 1:
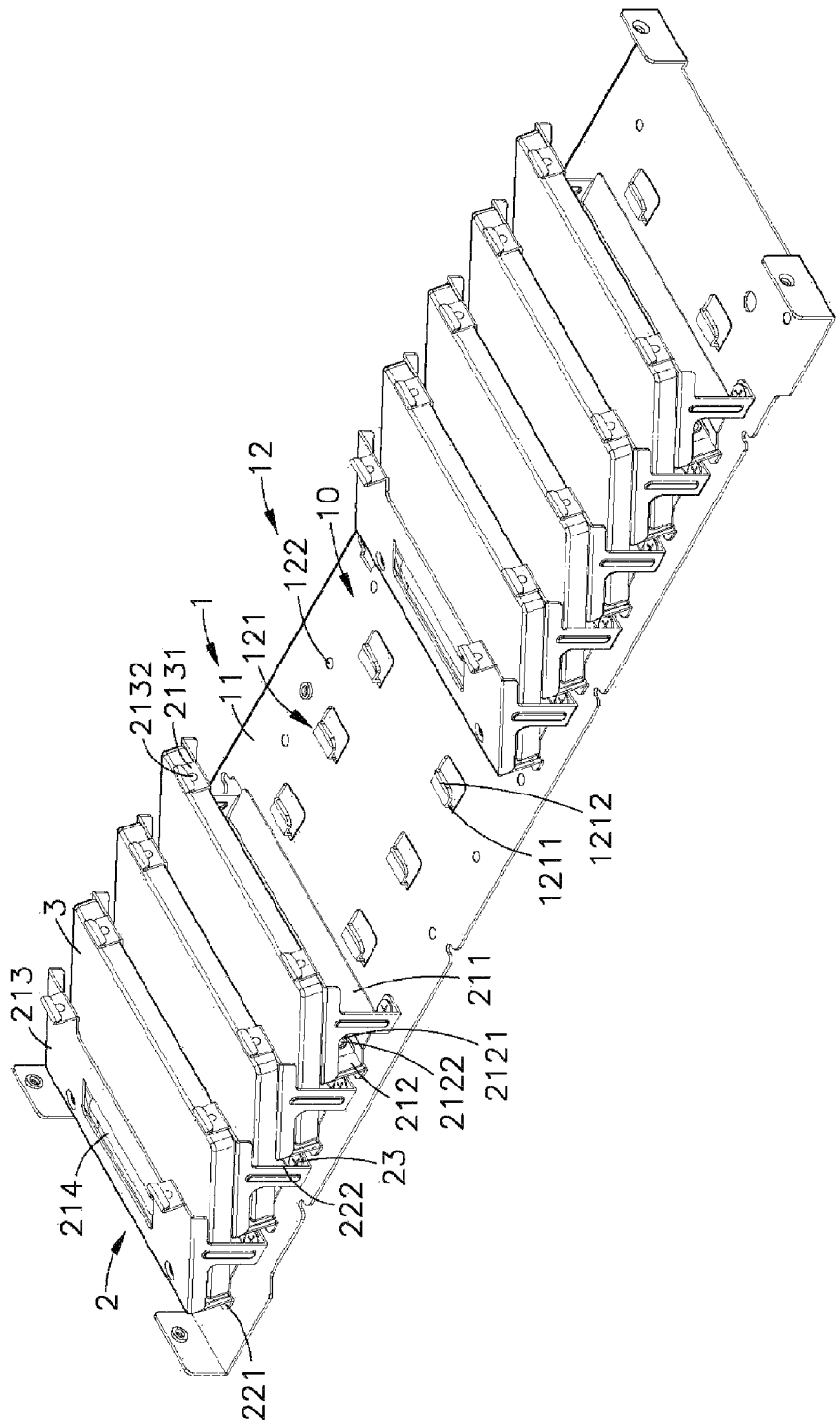
FIG. 1 is a perspective view of a high-density storage assembly of the present invention.

To achieve the aforesaid objectives and advantages, the structures and technical means of the present invention are illustrated with drawings and preferred embodiments of the present invention in terms of structures and functions and described below.

Referring to FIGS. 1, 2, 3, 4, there are shown a perspective view, an exploded view, another exploded view from another angle of view, and a lateral view taken when a recording medium machine is placed into a high-density storage assembly of the present invention. As shown in the diagrams, the high-density storage assembly of the present invention essentially comprises a casing 1 and an engaging mechanism 2.

The casing 1 has a receiving space 10. A substrate 11 is disposed at the bottom of the casing 1. A plurality of fixing portions 12 is disposed on the substrate 11. The fixing portions 12 each comprise two bent engaging plates 121 and two locking holes 122. Each engaging plate 121 comprises a support plate 1211 formed by stamping the substrate 11 in an upward direction and a guiding slope 1212 extending obliquely upward from a horizontal level.

The engaging mechanism 2 comprises a supporting portion 21 and a coupling portion 22 coupled to the fixing portions 12 in the casing 1. A horizontal bottom plate 211 and a baffle 212 capable of upward separation and connection are disposed at the supporting portion 21. Two obliquely-extending abutting leaf springs 2121 are disposed on the inner side of the baffle 212. The abutting leaf springs 2121 are each a resilient structure. Abutting bumps 2122 are disposed on the surfaces of the abutting leaf springs 2121. A supporting plate 213 extending horizontally is disposed at the top end of the baffle 212. Two limit plates 2131 bending upward are disposed at the free ends of the supporting plates 213. Limit bumps 2132 are disposed on the two limit plates 2131, face the abutting leaf springs 2121, and correspond in position to the abutting bumps 2122 of adjacent said engaging mechanisms 2. A bent pressing leaf spring 214 is disposed on each supporting plate 213 and tilts downward. The coupling portion 22 has a positioning portion 221 extending outward from the bottom plate 211 to the baffle 212 for a distance. Positioning holes 2211 corresponding in position to two bent engaging plates 121 are concavely disposed on the outer edge of the positioning portion 221. Two ends of the supporting plates 213 each extend downward to form supporting arms 222 and fixing holes 2221 each with a horizontal bottom. The fixing holes 2221 correspond in position to two locking holes 122. A screw 23 passes through the fixing holes 2221 to get screwedly fixed to the locking holes 122 each.

Figure 2:
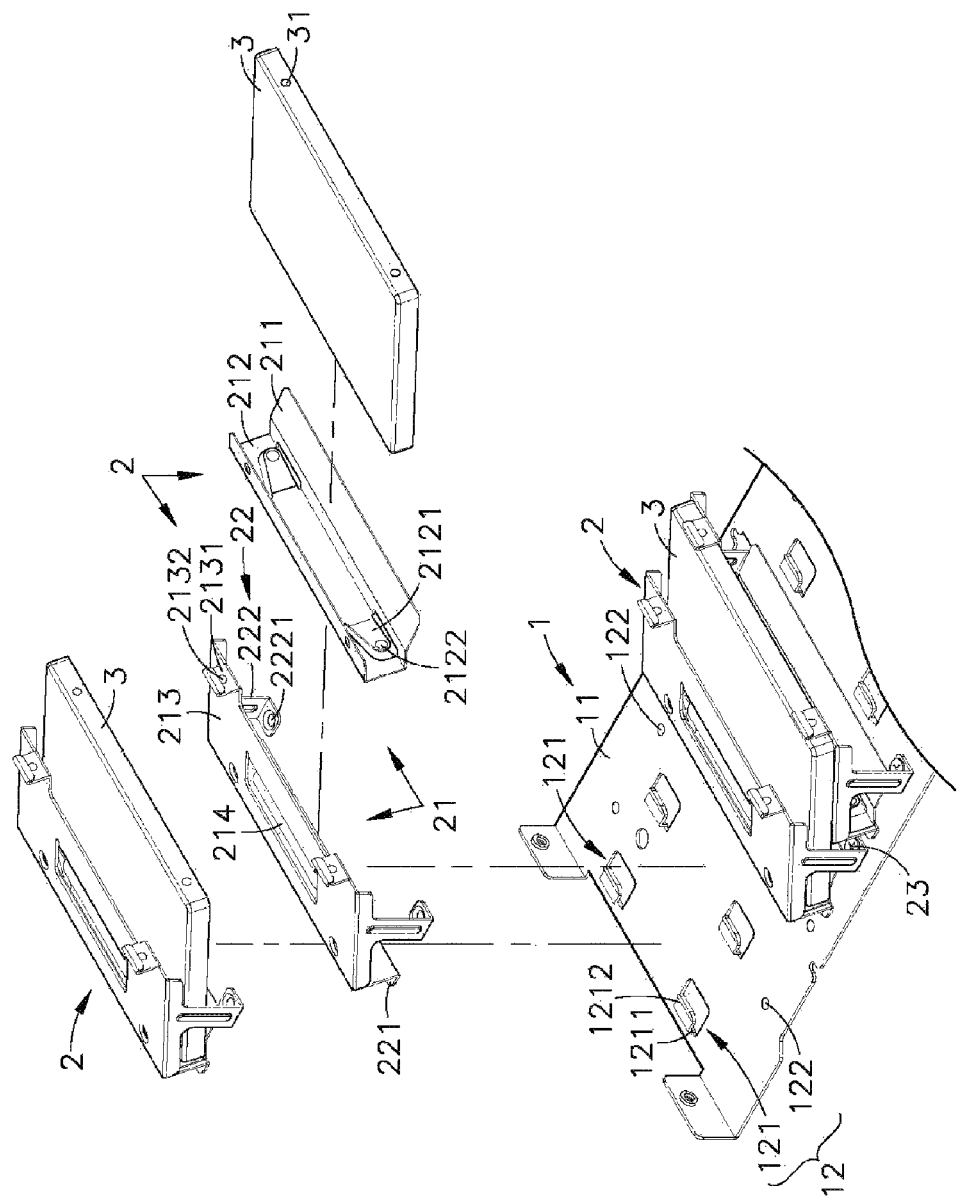
FIG. 2 is a exploded view of the high-density storage assembly of the present invention.
Figure 3:
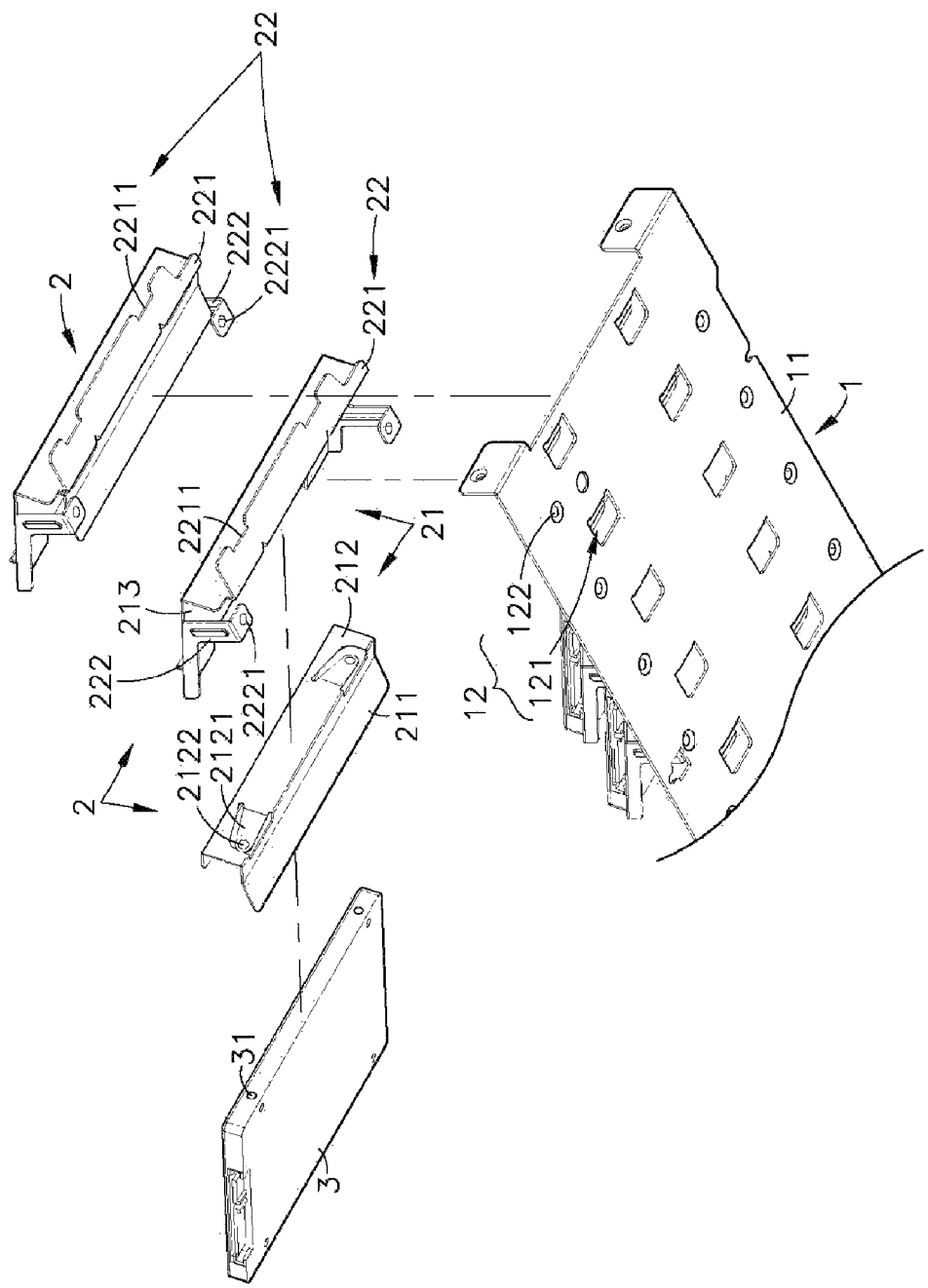
FIG. 3 is another exploded view of the high-density storage assembly of the present invention.
Figure 4:
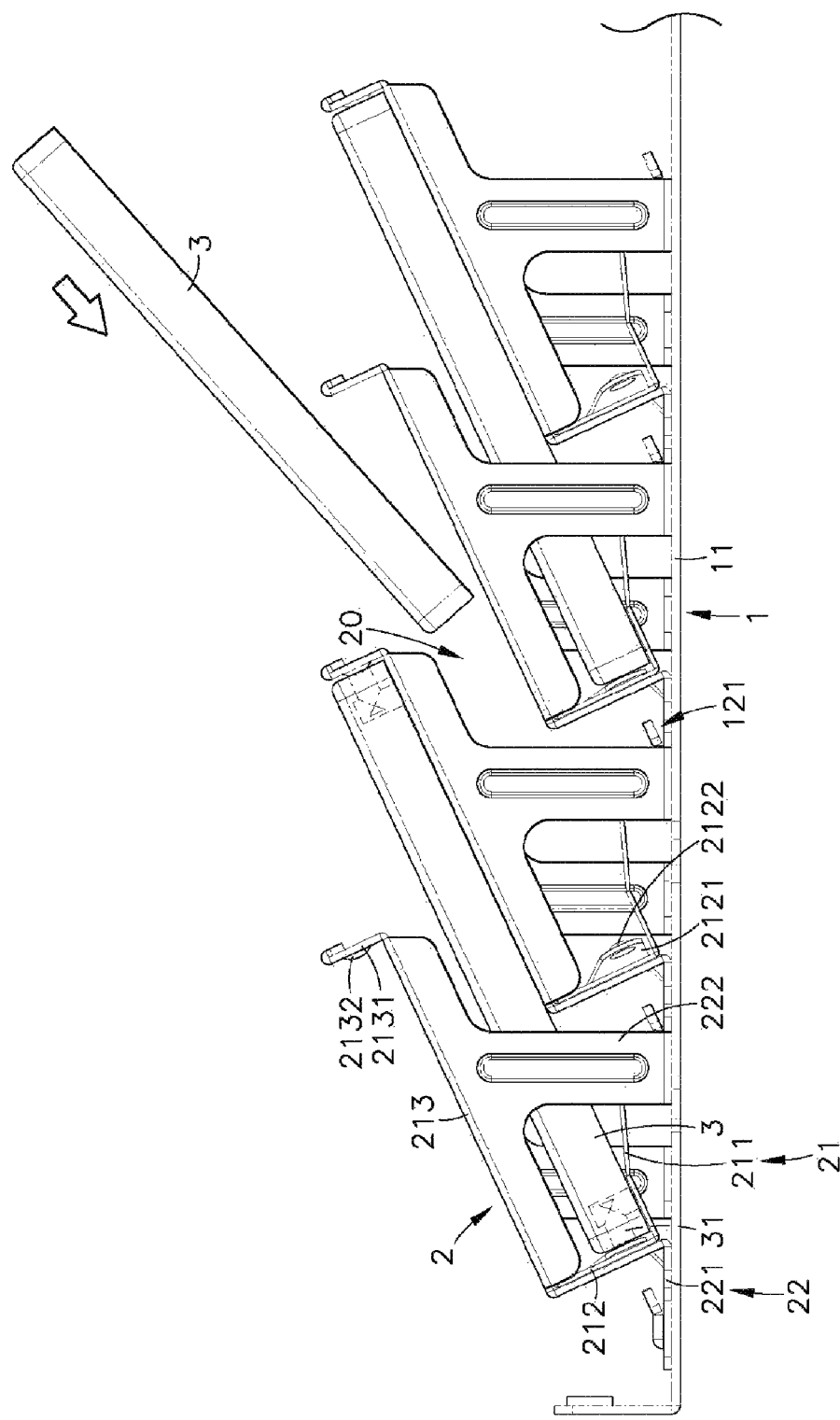
FIG. 4 is a lateral view of the high-density storage assembly of the present invention.

Referring to FIGS. 2, 3, 4, there are shown an exploded view, another exploded view from another angle of view, and a lateral view taken when a recording medium machine is placed into a high-density storage assembly of the present invention. To mount the engaging mechanisms 2 on the substrate 11 at the bottom of the casing 1, it is feasible for three positioning holes 2211 of the positioning portion 221 of the coupling portion 22 to be pushed into space formed by the support plates 1211 from below the guiding slopes 1212 of the engaging plates 121, respectively, and held therein. The fixing holes 2221 at the bottoms of the supporting arms 222 correspond in position to the locking holes 122, respectively. The screws 23 pass through the fixing holes 2221 to get screwedly fixed to the locking holes 122, respectively. By the aforesaid assembly process, the other engaging mechanisms 2 are arranged side by side in a transverse width direction such that a containing space 20 for containing a recording medium machine 3 is formed by and between lower surfaces of the supporting plates 213 of the outermost engaging mechanism 2, the inner sides of the baffles 212, and upper surfaces of the supporting plates 213 of adjacent said engaging mechanisms 2. Users mount at least three engaging mechanisms 2 on the substrate 11 at the bottom of the casing 1 as needed to finalize the assembly process. The height by which the coupling portion 22 extends upward and obliquely to form the supporting plates 213 conforms with the height of the receiving space 10 of the casing 1.

Referring to FIGS. 2, 3, 4, there are shown an exploded view, another exploded view from another angle of view, and a lateral view taken when a recording medium machine is placed into a high-density storage assembly of the present invention. In practice, users use the wider side of the recording medium machine 3 to obliquely push the pressing leaf spring 214 inside the containing space 20 into the baffle 212 so that the recording medium machine 3 presses against the two abutting leaf springs 2121 to effectuate a resilient deformation; meanwhile, two engaging holes 31 of the recording medium machine 3 fit around the abutting bumps 2122 to effectuate a positioning. At this point in time, when the users loosen the recording medium machine 3, the two abutting leaf springs 2121 push and cause the recording medium machine 3 to exert a resilient restoring force toward the mouth of the containing space 20. Hence, the outer side of the recording medium machine 3 and the two engaging holes 31 thereof abut against the limit plates 2131 and fit around the limit bumps 2132, respectively, to effectuate a positioning. The other recording medium machines 3 can be mounted by following the aforesaid steps, so as to finalize the mounting of all the recording medium machines 3. However, the aforesaid spatial design ensures that the recording medium machines 3 can be contained in the containing space 20 to effectuate a positioning. Even if the casing 1 is subjected to collisions or vibrations while being transported, the aforesaid design will ensure structural stability and precise positioning for two reasons as follows: first, paths of outward ejection of the recording medium machines 3 are blocked as a result of the presence of the pressing leaf spring 214 above and the limit plates 2131 outside the containing space 20, which are made of a rigid material; second, even if the two abutting leaf springs 2121 below undergo mild resilient deformation, they will be unlikely to escape from the containing space 20.

Referring to FIG. 4, there is shown a lateral view taken when a recording medium machine is placed into a high-density storage assembly of the present invention. The recording medium machine 3 can be removed by following the steps described below. The users push the recording medium machine 3 in a manner that it presses against the two abutting leaf springs 2121 to effectuate a resilient deformation so that the outer side of the recording medium machine 3 and the two engaging holes 31 thereof get disengaged from the limit plates 2131 and the limit bumps 2132 simultaneously, thereby allowing the recording medium machine 3 to move obliquely and thus exit the containing space 20. At this point in time, the two abutting leaf springs 2121 are in a resilient restoration state. Therefore, the users can take out the recording medium machine 3 easily without any tool, thereby enhancing the ease of changing the recording medium machine 3.

Figure 5:
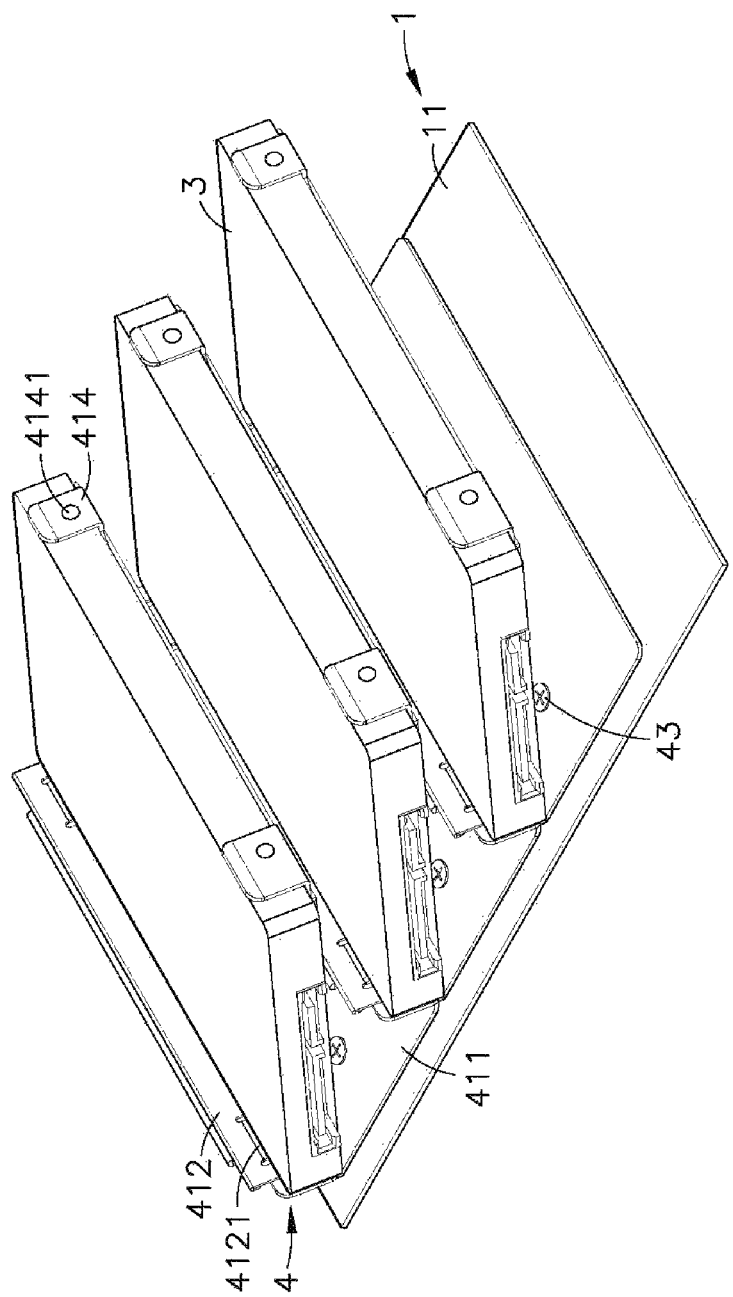
FIG. 5 is a perspective view of the high-density storage assembly according to another preferred embodiment of the present invention.
Figure 6:
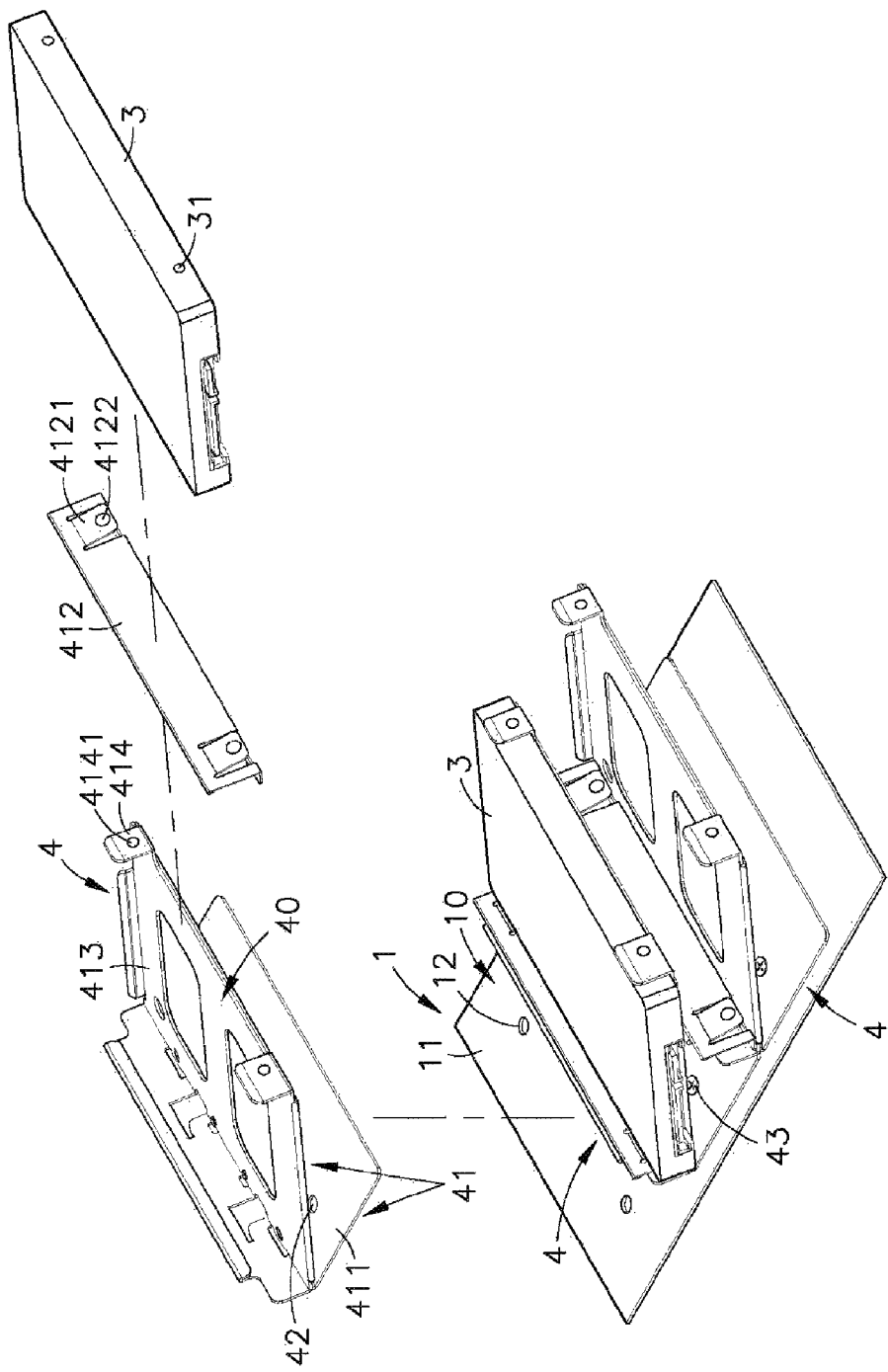
FIG. 6 corresponds to FIG. 5 is a exploded view of the high-density storage assembly according to another preferred embodiment of the present invention.

Referring to FIGS. 5, 6, there are shown a perspective view and an exploded view of a high-density storage assembly according to another preferred embodiment of the present invention. As shown in the diagrams, the fixing portions 12 of the substrate 11 of the casing 1 are each connected to a coupling portion 42 on a bottom plate 411 of the engaging mechanism 4. In this embodiment, the coupling portion 42 is screwedly fixed to the fixing portions 12 with a screw 43, and one end of the coupling portion 42 extends upward and obliquely to form a supporting portion 41 with supporting plates 413. The engaging mechanisms 4 are arranged side by side in a transverse width direction. Limit bumps 4141 of limit plates 414 are disposed at the supporting plates 413 of the supporting portion 41 and correspond in position to one of the engaging holes 31 of the recording medium machine 3. An abutting leaf spring 4121 capable of resilient deformation and restoration is disposed at the supporting plates 413 of the supporting portion 41 and corresponds in position to the other engaging hole 31 of the recording medium machine 3. Bottoms of the upper surfaces of the supporting plates 413 extend in a surface direction to form the limit plates 414. The abutting leaf spring 4121 corresponds in position to the limit plates 414. The abutting leaf spring 4121 is a resilient structure. A containing space 40 which the recording medium machine 3 is placed in and positioned at is formed between the limit plates 414 and the abutting leaf spring 4121 on the supporting portion 41. The other engaging hole 31 fits around the abutting bumps 4122 each. The two abutting leaf springs 4121 are formed by extending downward and obliquely two ends of a baffle 412 capable of being separated from, connected to, and positioned at the supporting portion 41 obliquely and from behind.

Referring to FIGS. 4, 5, 6, in two embodiments of the present invention, baffles 212, 412 of the engaging mechanisms 2, 4 are capable of being separated from, connected to, and positioned at the supporting portions 21, 41 obliquely and from behind. Barring the baffles 212, 412, the engaging mechanisms 2, 4 are made of a rigid material, such as zinc-plated steel sheet or hot-dip galvanized steel in coils (SGCC). The baffles 212, 412, the abutting leaf springs 2121, and the abutting leaf springs 4121 are made of a resilient material, such as plastic, stainless steel, and manganese steel. Furthermore, according to the present invention, there are plenty of ways of connecting the coupling portions 22, 42 of the engaging mechanisms 2, 4 to the fixing portions 12 of the substrate 11 of the casing 1; hence, the coupling portions 22, 42 can be directly coupled to the fixing portions 12 of the substrate 11 with the screws 23, 43, a means of engagement, or a means of positioning. Although the present invention is disclosed above by embodiments, the embodiments are not restrictive of the claims of the present invention. All equivalent changes and modifications made to the embodiments without departing from the spirit embodied in the present invention shall fall within the claims of the present invention.

The present invention is characterized in that: the fixing portions 12 of the substrate 11 of the casing 1 are each connected to the coupling portion 22 of the engaging mechanism 2; the coupling portion 22 extends upward and obliquely to form the supporting portion 21; the recording medium machine 3 can be movably mounted in and dismounted from the containing space 20 by the supporting portion 21; the engaging mechanisms 2 are arranged side by side in a transverse width direction; hence, the recording medium machine 3 is obliquely contained in the containing space 20 of the engaging mechanism 2 on the substrate 11 of the casing 1, and the engaging mechanisms 2 are arranged side by side in a transverse width direction, so as to effectively reduce the mounting/demounting height of the recording medium machine 3 and increase the quantity of the recording medium machines 3, thereby increasing data access capacity greatly. The spatial design provides different numbers and densities of the engaging mechanisms 2 according to user needs to thereby reduce material costs and effectuate resilient production. The present invention is further characterized in that: a spatial state of oblique arrays is achieved by forming the containing space 20 between the supporting portions 21 of adjacent said engaging mechanisms 2 to hold the recording medium machine 3 or forming the containing space 20 on the supporting portions 21 directly to hold the recording medium machine 3 so that more said recording medium machines 3 are contained in the casing 1 of limited height and space.

What is claimed is:

1. A high-density storage assembly, comprising a casing, an engaging mechanism, and a recording medium machine, characterized in that: the casing has a receiving space, with a plurality of fixing portions disposed on a substrate at a bottom of the casing, wherein the engaging mechanism comprises at least two supporting portions arranged in a side by side in a transverse width direction, each comprising a coupling portion and a supporting plate, with the coupling portions connected to the fixing portions of the substrate of the casing, respectively, and extended upward and obliquely to form the supporting plates, wherein a containing space for movably placing and positioning the recording medium machine is formed between an abutting leaf spring and a limit plate which are disposed on a lower surface of the supporting plate of one of two adjacent said supporting portions and an upper surface of the supporting plate of another said supporting portion, respectively, wherein the abutting leaf spring and the limit plate abut against the recording medium machine, with the abutting leaf spring being a resilient structure.

2. The high-density storage assembly of claim 1, wherein the lower surface of the supporting plate, which the abutting leaf spring is disposed on, extends in a surface direction to form a baffle, wherein the abutting leaf spring is disposed in a direction in which the baffles face the limit plates, and the limit plates are formed by extending the upper surfaces of the supporting plates in a surface direction, with the abutting leaf springs corresponding in position to the limit plates, respectively.

3. The high-density storage assembly of claim 2, wherein a plurality of engaging holes is disposed on each of two sides of the recording medium machine, whereas abutting bumps are disposed at the abutting leaf springs, with limit bumps disposed on the limit plates, wherein the abutting bumps and the limit bumps are engaged with the engaging holes of the recording medium machine, respectively.

4. The high-density storage assembly of claim 2, wherein each said baffle horizontally extends to form a bottom plate.

5. The high-density storage assembly of claim 2, wherein the supporting plates each extend from surfaces thereof downward and obliquely to form a bent pressing leaf spring.

6. The high-density storage assembly of claim 2, wherein the baffles of the engaging mechanism are capable of being separated from, connected to, and positioned at the supporting portions obliquely and from behind, wherein, barring the baffles, the engaging mechanism is made of a rigid material comprising one of zinc-plated steel sheet and hot-dip galvanized steel in coils, wherein the baffles and the abutting leaf springs thereof are made of a resilient material comprising one of plastic, stainless steel, and manganese steel.

7. The high-density storage assembly of claim 2, wherein two bent engaging plates are disposed at the fixing portions of the casing, and the coupling portion of the supporting plate of each said supporting portion comprises a positioning portion, with the positioning portions extending outward from bottom ends of the supporting plates for a distance, and positioning holes corresponding in position to the two bent engaging plates are concavely disposed on an outer edge of the positioning portion.

8. The high-density storage assembly of claim 2, wherein the fixing portions of the casing comprise two locking holes, wherein two ends of the supporting plates each extend downward to form supporting arms and fixing holes each with a horizontal bottom, with the fixing holes corresponding in position to the two locking holes, respectively, screws pass through the fixing holes to get screwedly fixed to the locking holes, respectively.

9. The high-density storage assembly of claim 1, wherein two bent engaging plates and two locking holes are disposed at the fixing portions of the casing, and the coupling portion of the supporting plate of each said supporting portion comprises a positioning portion, with the positioning portions extending outward from bottom ends of the supporting plates for a distance, wherein positioning holes corresponding in position to the two bent engaging plates are concavely disposed on an outer edge of the positioning portion, and two ends of the supporting plates each extend downward to form supporting arms and fixing holes each with a horizontal bottom, with the fixing holes corresponding in position to the two locking holes, respectively, screws pass through the fixing holes to get screwedly fixed to the locking holes, respectively.

10. The high-density storage assembly of claim 9, wherein support plates and a guiding slope extending horizontally upward are formed by stamping the engaging plates upward from the substrate.

11. The high-density storage assembly of claim 1, wherein a height by which the coupling portion extends upward and obliquely to form the supporting plates conforms with a height of the receiving space of the casing.

12. A high-density storage assembly, comprising a casing, an engaging mechanism, and a recording medium machine, characterized in that: the casing has a receiving space, with a fixing portion disposed on a substrate at a bottom of the casing, wherein the engaging mechanism comprises supporting portions arranged in a transverse width direction and each comprising a coupling portion and a supporting plates, with the coupling portions connected to the fixing portion of the substrate of the casing and extended upward and obliquely to form the supporting plates, respectively, wherein an abutting leaf spring and a limit plate are disposed at a bottom and a top of the supporting plates each, wherein a containing space for movably placing and positioning the recording medium machine is formed between the abutting leaf springs and the limit plates, wherein the abutting leaf springs and the limit plates abut against the recording medium machine, with the abutting leaf springs being each a resilient structure.

13. The high-density storage assembly of claim 12, wherein bottoms of upper surfaces of the supporting plates extend in a surface direction to form the abutting leaf springs, wherein the abutting leaf springs correspond in position to the limit plates, respectively, wherein tops of upper surfaces of the supporting plates extend in a surface direction to form the limit plates, with the abutting leaf springs corresponding in position to the limit plates, respectively.

14. The high-density storage assembly of claim 12, wherein a plurality of leaf springs is disposed on each of two sides of the recording medium machine, wherein abutting bumps are disposed at the abutting leaf springs, with limit bumps disposed on the limit plates, wherein the abutting bumps and the limit bumps are engaged with the leaf springs of the recording medium machine, respectively.

15. The high-density storage assembly of claim 12, wherein limit bumps of limit plates are disposed on one of engaging holes of the recording medium machine and correspond in position to the supporting portion, whereas the abutting leaf spring with a baffle capable of resilient deformation and restoration is disposed on another engaging hole of the recording medium machine and corresponds in position to the supporting portion, with the engaging holes fitting around the abutting bumps, respectively.

16. The high-density storage assembly of claim 12, wherein the engaging mechanism is made of a rigid material, such as zinc-plated steel sheet or hot-dip galvanized steel in coils, whereas the abutting leaf springs are made of a resilient material comprising one of plastic, stainless steel and manganese steel.

* * * * *